United States Patent
Hyde et al.

(10) Patent No.: US 8,440,923 B2
(45) Date of Patent: May 14, 2013

(54) ELECTRICAL CLOSING SWITCH MADE FROM REACTIVE COMPOSITE MATERIALS

(75) Inventors: Roderick A. Hyde, Redmond, WA (US); Muriel Y. Ishikawa, Livermore, CA (US); Jordin T. Kare, Seattle, WA (US); Thomas J. Nugent, Jr., Issaquah, WA (US); Lowell L. Wood, Jr., Bellevue, WA (US)

(73) Assignee: The Invention Science Fund I LLC

( * ) Notice: Subject to any disclaimer, the term of this patent is extended or adjusted under 35 U.S.C. 154(b) by 655 days.

(21) Appl. No.: 12/381,531

(22) Filed: Mar. 11, 2009

(65) Prior Publication Data

US 2010/0102921 A1 Apr. 29, 2010

Related U.S. Application Data

(63) Continuation-in-part of application No. 12/290,016, filed on Oct. 23, 2008, and a continuation-in-part of application No. 12/291,840, filed on Nov. 12, 2008.

(51) Int. Cl.
*H01L 47/00* (2006.01)
*H01H 1/02* (2006.01)

(52) U.S. Cl.
USPC .......... 200/262; 200/52 R; 365/163; 365/164; 365/165; 257/2; 257/3; 257/4

(58) Field of Classification Search .................. 200/181, 200/52 R, 600, 262–267
See application file for complete search history.

(56) References Cited

U.S. PATENT DOCUMENTS

| | | | |
|---|---|---|---|
| 3,660,182 A | 5/1972 | Cook et al. | |
| 3,816,952 A | 6/1974 | Niebyski et al. | |
| 4,317,769 A | 3/1982 | Saito et al. | |
| 4,909,842 A | 3/1990 | Dunmead et al. | |
| 5,381,944 A | 1/1995 | Makowiecki et al. | |
| 5,536,947 A * | 7/1996 | Klersy et al. | 257/3 |
| 5,538,795 A | 7/1996 | Barbee, Jr. et al. | |
| 5,547,715 A | 8/1996 | Barbee, Jr. et al. | |
| 6,055,180 A * | 4/2000 | Gudesen et al. | 365/175 |
| 6,991,855 B2 | 1/2006 | Weihs et al. | |
| 7,020,006 B2 * | 3/2006 | Chevallier et al. | 365/148 |
| 7,143,568 B2 | 12/2006 | Van Heerden et al. | |
| 7,186,998 B2 * | 3/2007 | Ovshinsky et al. | 257/3 |
| 7,358,823 B2 * | 4/2008 | Abadeer et al. | 331/177 V |
| 7,459,933 B2 * | 12/2008 | Mouttet | 326/38 |
| 7,644,854 B1 | 1/2010 | Holmes et al. | |
| 7,763,552 B2 * | 7/2010 | Tong et al. | 438/795 |
| 7,855,435 B2 * | 12/2010 | Klostermann et al. | 257/584 |
| 7,910,904 B2 * | 3/2011 | Kuo et al. | 257/2 |
| 7,929,335 B2 * | 4/2011 | Gopalakrishnan | 365/163 |

(Continued)

FOREIGN PATENT DOCUMENTS

GB 893260 A 4/1962

OTHER PUBLICATIONS

UK Intellectual Property Office Examination Report Under Section 18(3); App. No. GB0918676.8; Aug. 5, 2011; pp. 1-3.

(Continued)

*Primary Examiner* — Michael Friedhofer

(57) ABSTRACT

Devices and components that can interact with or modify propagation of electromagnetic waves are provided. The design, fabrication and structures of the devices exploit the properties of reactive composite materials (RCM) and reaction products thereof.

35 Claims, 15 Drawing Sheets

U.S. PATENT DOCUMENTS

| | | | |
|---|---|---|---|
| 7,969,770 B2* | 6/2011 | Chen et al. ................... | 365/163 |
| 7,994,034 B2* | 8/2011 | Fournier et al. .............. | 438/584 |
| 2003/0164289 A1 | 9/2003 | Weihs et al. | |
| 2003/0232179 A1 | 12/2003 | Steenblik et al. | |
| 2006/0068179 A1 | 3/2006 | Weihs et al. | |
| 2007/0183919 A1 | 8/2007 | Ayer et al. | |
| 2007/0188385 A1 | 8/2007 | Hyde et al. | |

OTHER PUBLICATIONS

Caloz, Christophe; Itoh, Tatsuo; "Electromagnetic Metamaterials: Transmission Line Theory and Microwave Applications"; dated Nov. 2005; ISBN: 0-471-75431-5; Wiley-IEEE Press.

Eleftheriades, G. V.; Balmain, K. G; "Negative Refraction Metamaterials: Fundamental Principles and Applications"; dated Jul. 7, 2005; ISBN: 0-471-60146-2; Wiley-IEEE Press.

Pendry, J.B.; "Negative Refraction Makes a Perfect Lens"; Physical Review Letters; dated Oct. 30, 2000; pp. 3966-3969; vol. 85, No. 18; The American Physical Society.

Reiss, M.E. et al.; "Self-Propagating Formation Reactions in Nb/Si Multilayers"; Materials Science and Engineering; dated 1999; pp. 217-222; vol. A-261; Elsevier Science S.A.

Smith, D.R. et al.; "Review: Metamaterials and Negative Refractive Index"; Science; dated Aug. 6, 2004; pp. 788-792; vol. 305; located at: www.sciencemag.org.

Smith, David R. et al.; "Design and Measurement of Anisotropic Metamaterials that Exhibit Negative Refraction"; IEICE Trans. Electron; dated Mar. 2004; pp. 359-370; vol. E87-C, No. 3.

Combined Search and Examination Report dated Feb. 24, 2010; International App. No. GB0918676.8; pp. 1-6.

Southwire Product Catalog; printed on Nov. 30, 2011; pp. 1-2; Southwire Company; http://www.southwire.com/products/ProductCatalog.htm.

"Installing A 3-Way Switch With Wiring Diagrams"; bearing a date of 2004 and printed on Nov. 29, 2011; pp. 1-5; The Home Improvement Web Directory; http://homeimprovementweb.com/information/how-to/three-way-switch.htm.

Medimmune Ltd. V. Novartis Pharmaceuticals UK Ltd.; England and Wales High Court 1669 (Pat); Jul. 5, 2011; pp. 1-134.

UK Intellectual Property Office Examination Report under Section 18(3); Application No. GB0918676.8; Aug. 9, 2012; pp. 1-2.

Unilever V. Henkel; European Patent Office Case No. T 0435/91 (Detergents); Mar. 9, 1994; pp. 1-6.

* cited by examiner

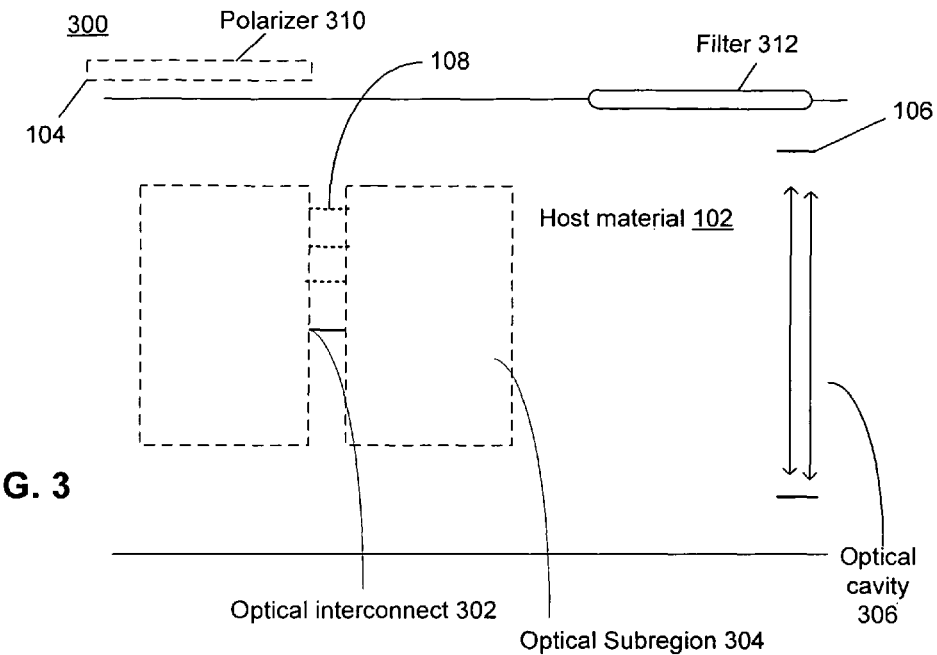
FIG. 3
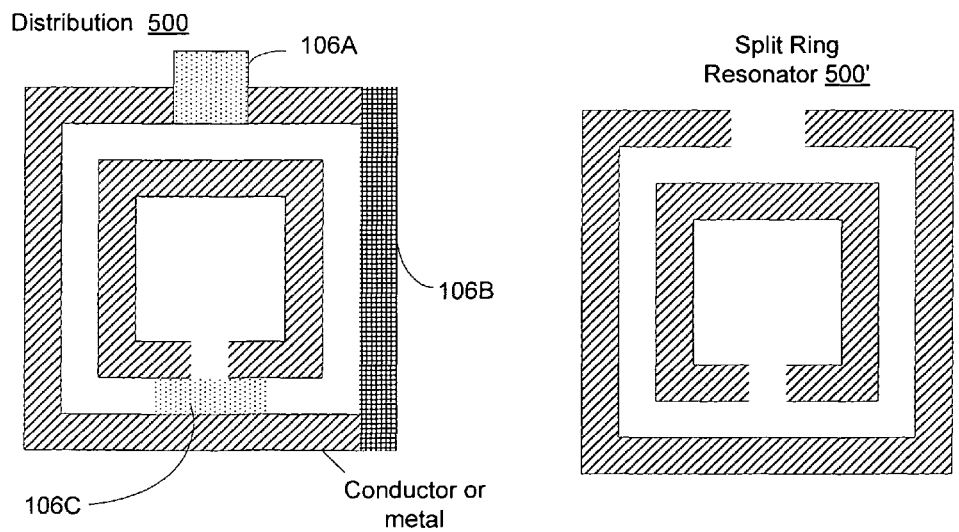
FIG. 5  RCM distribution in Metamaterial Component blank 100 for a split ring resonator device

METAMATERIAL BLANK 400

Artifical structural element 406

106

Pattern of RCM 106'

Arrangement of Artificial Structural elements 406'

Artifical structural element 606

Reacted material 108

Unreacted material 106

Selected configuration of Artificial Structural elements 606'

FIG. 7

Method 700

710
Provide a host material in a region defining an optical component

720
Provide reactive composite material(s) (RCM) in or proximate to the region defining the optical component 730
Alter optical properties of the region by selectively reacting a portion of the RCM in or proximate to the region.

FIG. 8

METHOD 800

810
Dispose a plurality of RCM in or proximate to a region defining the metamaterial component 820
Form a particular arrangement of artificial structural elements by selectively reacting the RCM in or proximate to the region defining the metamaterial component, whereby the region exhibits metamaterial properties related to the particular arrangement of artificial structural elements.

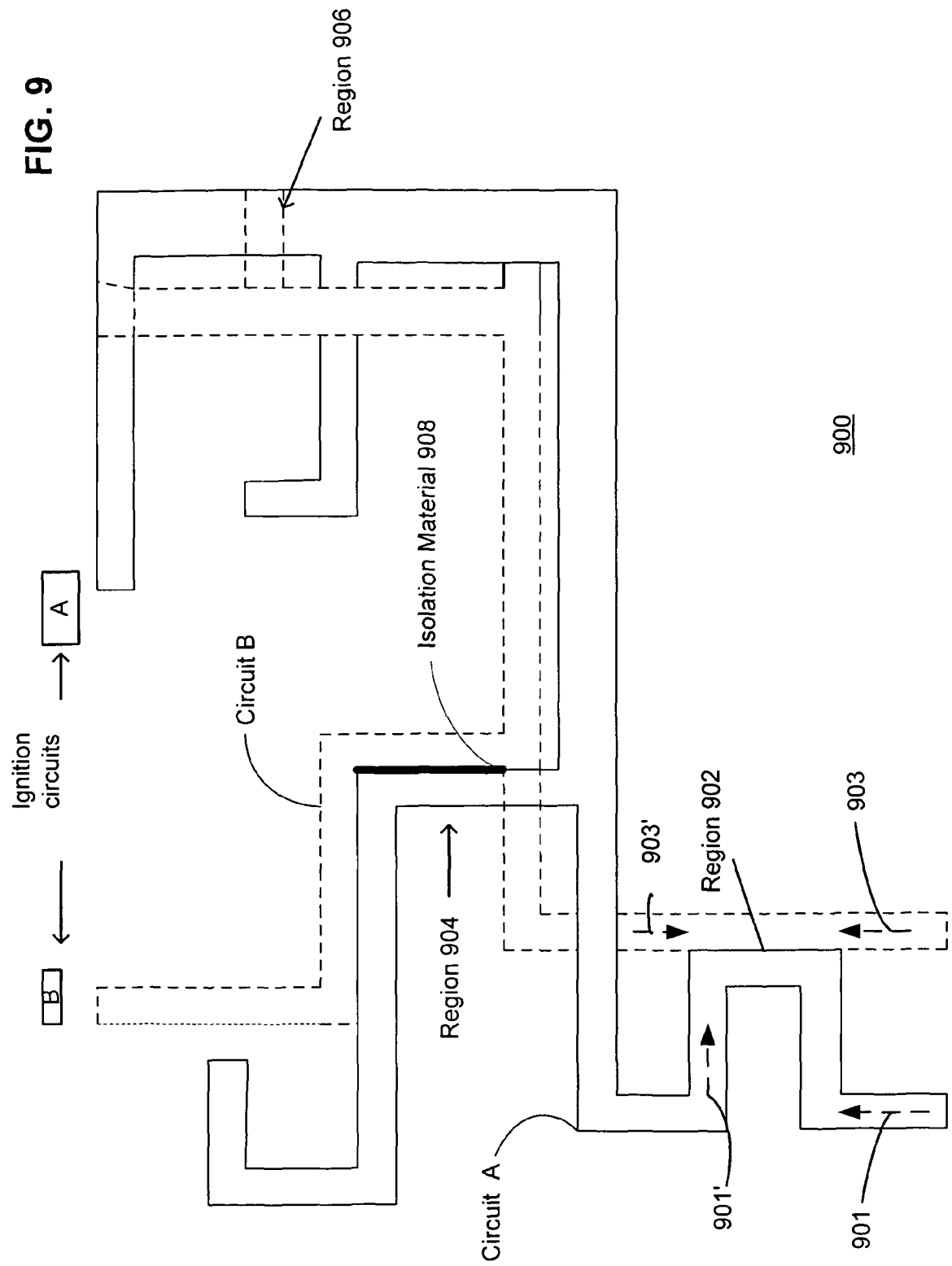

Reaction-propagation NAND gate

FIG. 12

1210
Provide a first set of reactive material segments (A) forming a first reaction-propagation pathway to an article region

1220
Provide a second set of reactive material segments (A) forming a second reaction-propagation pathway to the article region

1230
Providing a circuit-customization interface configured to receive stimuli to selectively ignite a reaction in one or more selected segments A and/or B according to a selected article design.

1510
Provide a programmable RCM body extending between the two conductors

1520
Controllably initiate a reaction in the programmable RMC body to make it conductive

1500

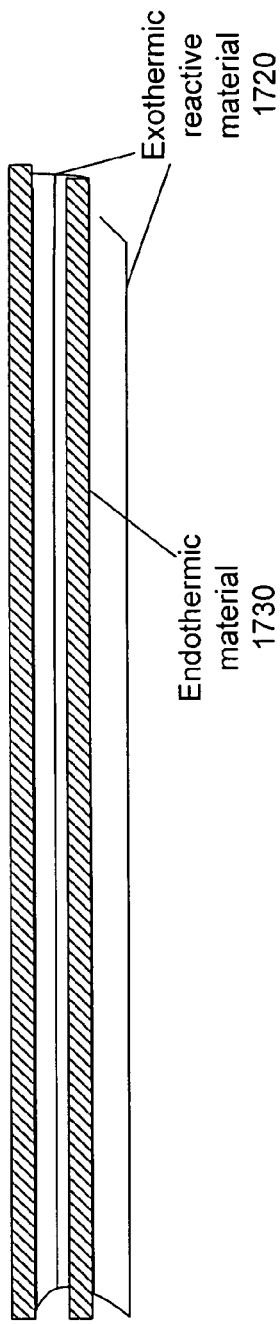
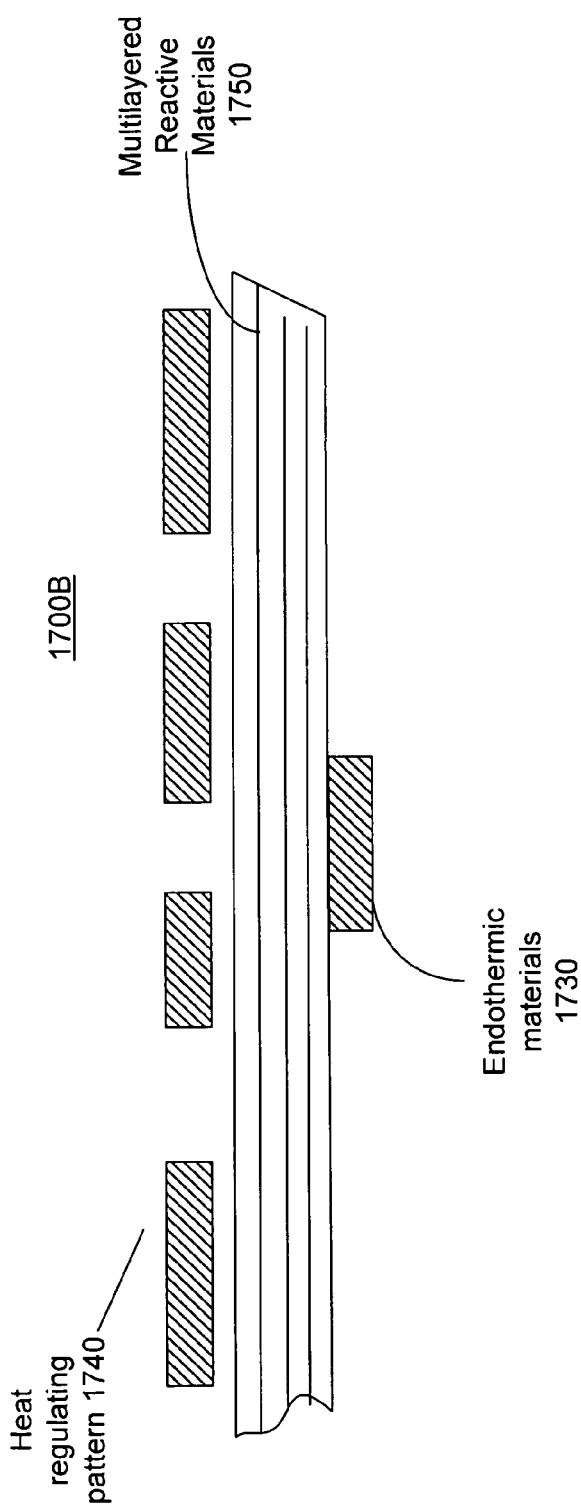

FIG. 18

1810
Provide an article having an arrangement of reactive composite materials

1820
React endothermic reactants proximate to the RCM to temper an exothermic reaction in the reactive composite materials

1800

SYSTEM 1900

US 8,440,923 B2

ELECTRICAL CLOSING SWITCH MADE FROM REACTIVE COMPOSITE MATERIALS

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

RELATED APPLICATIONS

1. For purposes of the USPTO extra-statutory requirements, the present application constitutes a continuation-in-part of U.S. patent application Ser. No. 12/290,016, entitled OPTICAL AND METAMATERIAL DEVICES BASED ON REACTIVE COMPOSITE MATERIALS, naming Kenneth G. Caldeira, Peter L. Hagelstein, Roderick A. Hyde, Muriel Y. Ishikawa, Edward K. Y. Jung, Jordin T. Kare, Nathan P. Myhrvold, Thomas J. Nugent, Jr., John Brian Pendry, David Schurig, Clarence T. Tegreene, Charles Whitmer, and Lowell L. Wood, Jr. as inventors, filed on Oct. 23, 2008, which is currently co-pending, or is an application of which a currently co-pending application entitled to the benefit of the filing date.

2. For purposes of the USPTO extra-statutory requirements, the present application constitutes a continuation-in-part of U.S. patent application Ser. No. 12/291,840, entitled FOAM-LIKE STRUCTURES BASED ON REACTIVE COMPOSITE MATERIALS naming, Roderick A. Hyde, Muriel Y. Ishikawa, Edward K. Y. Jung, Jordin T. Kare, Alois A. Langer, Eric C. Leuthardt, Nathan P. Myhrvold, Thomas J. Nugent, Jr., Clarence T. Tegreene, Charles Whitmer, Lowell L. Wood, Jr. and Richard N. Zare as inventors, filed on Nov. 12, 2008, which is currently co-pending, or is an application of which a currently co-pending application entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

BACKGROUND

Reactive composite materials (RCM) may include one or more reactive materials that react upon proper excitation. Exemplary RCM include powdered materials (e.g., powder compacts or mixtures) disposed in binders (e.g., epoxy). Other exemplary RCM include mechanically-shaped combinations of reactive materials (e.g., aluminum and nickel, and titanium and boron carbide).

The RCM may be disposed as layers, islands, or particles in a composite structure. A reaction that is suitably initiated at a starting location or point in the RCM may self-propagate through the RCM disposed in the composite structure changing the structural properties of the latter. For example, Weihs et al. U.S. Patent Application No. 20060068179 A1 describes electrical circuit fuses, which are made of RCM that undergo an exothermic chemical reaction and break-up to interrupt current flow in a circuit. Further, for example, Makowiecki et al. U.S. Pat. No. 5,381,944 Barbee et al. U.S. Pat. No. 5,538,795, and Van Heerden et al. U.S. Pat. No. 7,143,568 describes the use of the use of energy-releasing RCM for local joining (e.g., bonding, welding, soldering or brazing) of two bodies or objects. All of the aforementioned patents and patent application are incorporated by reference in their entireties herein.

Consideration is now being given to incorporating RCM in the design, fabrication and structure of devices that can interact with or modify propagation of electromagnetic waves. The devices of interest include devices for interacting with or modify propagation of electromagnetic waves in any part of the electromagnetic spectrum (e.g., visible, infrared, ultraviolet light; X-rays, microwaves, radio waves, and other forms of electromagnetic radiation) or to materials that interact with other forms of energy, such as acoustic or other waves. Attention is particularly directed toward using RCM in the design, fabrication and structure of interconnects and switching devices.

SUMMARY

In one aspect, articles based on reactive composite materials or reaction products thereof are provided.

In one aspect, devices and components that can interact with or modify propagation of electromagnetic waves are provided. The design, fabrication and structures of the devices exploit the properties of reactive composite materials (RCM) and reaction products thereof.

A method for making, for example, an optical component, includes providing a host material in a region defining the optical component and providing reactive composite material(s) (RCM) in or proximate to the region. The method further includes altering optical properties of the region by selectively reacting a portion of the RCM in or proximate to the region.

A customizable optical component blank includes a host material and a pattern of RCM disposed in or proximate to the region defining the optical component blank. The pattern of RCM corresponds to one or more selectable optical component configurations.

An optical component includes a host material and reaction product material resulting from selectively reacted RCM disposed in or proximate to the region defining the optical component.

A method for making, for example, a metamaterial optical component, includes disposing a plurality of RCM in or proximate to a region defining the metamaterial component, forming a particular arrangement of artificial structural elements by selectively reacting the RCM in or proximate to the region defining the metamaterial component. The region exhibits metamaterial properties related to the particular arrangement of artificial structural elements.

A customizable metamaterial component blank includes a pattern of RCM disposed in or proximate to a region defining the metamaterial component blank. The pattern of RCM corresponds to one or more selectable metamaterial component configurations of artificial structural elements.

A metamaterial component includes a particular arrangement of artificial structural elements that provide metamaterial properties to the metamaterial component. The particular arrangement of artificial structural elements includes reaction product material resulting from selectively reacted RCM disposed in or proximate to a region defining the metamaterial component.

An article may include first and second sets of reactive material segments A and B, which provide alternate reaction-propagation pathways (e.g., first and second reaction pathways, respectively) to at least one region of the article. A circuit-customization interface is configured to receive energy stimuli to selectively ignite a reaction in one of the segments and propagate the reaction on a selected reaction-propagation pathway to the at least one region in the article.

The article may include a reactive material segment B interposed between the two sub-circuits of reactive material segments A. The interposed segment B may have selected reactive properties that allow or inhibit propagation of a reaction from one sub-circuit to the second sub-circuit according to its reaction state.

The article may include a third set of reactive material segments C. A pair of reactive material segments A and B may be configured as inputs to a reaction-propagation NAND gate having a segment C as its output. The NAND gate comprises reactive materials that inhibit reaction propagation in the C segment only upon reactions in both segment A and segment B.

A closing switch in an electrically active circuit may include a programmable reactive composite materials (RCM) body extending from a first terminal to a second terminal. The programmable RCM body may have an "open" non-conducting state and a "closed" conducting state corresponding to a pre-reaction state and a post-reaction state, respectively. A programming interface may be configured to programmably switch the RCM body from its open non-conducting state to its closed conducting state. The programming interface may include an ignition element configured to controllably initiate a reaction in the programmable RCM body to close the switch.

An article may include an arrangement of reactive composite materials (RCM), and one or more endothermic reactants configured to modulate or temper a reaction in the RCM and/or its effects. The endothermic reactants may include a thermally dissociative molecule and/or two or more reactive chemical species. Different endothermic reactants may be disposed in different layers (e.g., adjoining layers) or intermixed.

The endothermic reactants may be selected to have an endothermic reaction with a negative Gibbs free energy change, but either a negative or positive enthalpy change. Accordingly, the endothermic reactants may absorb energy or release energy upon reaction.

The foregoing summary is illustrative only and is not intended to be limiting. In addition to the illustrative aspects, embodiments, and features described above, further aspects, embodiments, and features of the solutions will become apparent by reference to the drawings and the following detailed description.

BRIEF DESCRIPTION OF THE FIGURES

In the accompanying drawings:

FIG. 3 is a schematic illustration of the optical component blank of FIG. 1 in selected portions of the RCM are reacted to make in to make an interconnect between two optical subregions, a filter, a polarizer and an optical cavity, in accordance with the principles of the solutions described herein;

FIG. 5 is a schematic illustration of an exemplary pattern of RCM distribution corresponding to a split ring resonator (SRR) device in a metamaterial component blank, in accordance with the principles of the solutions described herein;

FIGS. 7 and 8 are schematic illustrations of exemplary methods for making optical components and metamaterial components using reactive composite materials in accordance with the principles of the solutions described herein.

FIG. 9 is a schematic illustration of exemplary article blank including multiple reaction-propagation pathways or circuits made of reactive composite materials (RCM), in accordance with the principles of the solutions described herein;

FIG. 12 is schematic illustration of an exemplary method for making articles using reactive composite materials, in accordance with the principles of the solutions described herein.

FIG. 15 is schematic illustration of an exemplary method 1500 for controllably interconnecting two conductors using reactive composite materials, in accordance with the principles of the solutions described herein.

FIGS. 17A and 17B are schematic illustrations of an exemplary article blanks including exothermic and endothermic reactive composite materials (RCM) arranged in selected patterns, in accordance with the principles of the solutions described herein;

FIG. 18 is schematic illustration of an exemplary method for modulating or tempering an exothermic reaction and/or its effects in reactive composite materials, in accordance with the principles of the solutions described herein.

Throughout the figures, unless otherwise stated, the same reference numerals and characters are used to denote like features, elements, components, or portions of the illustrated embodiments.

DESCRIPTION

Figure 1:
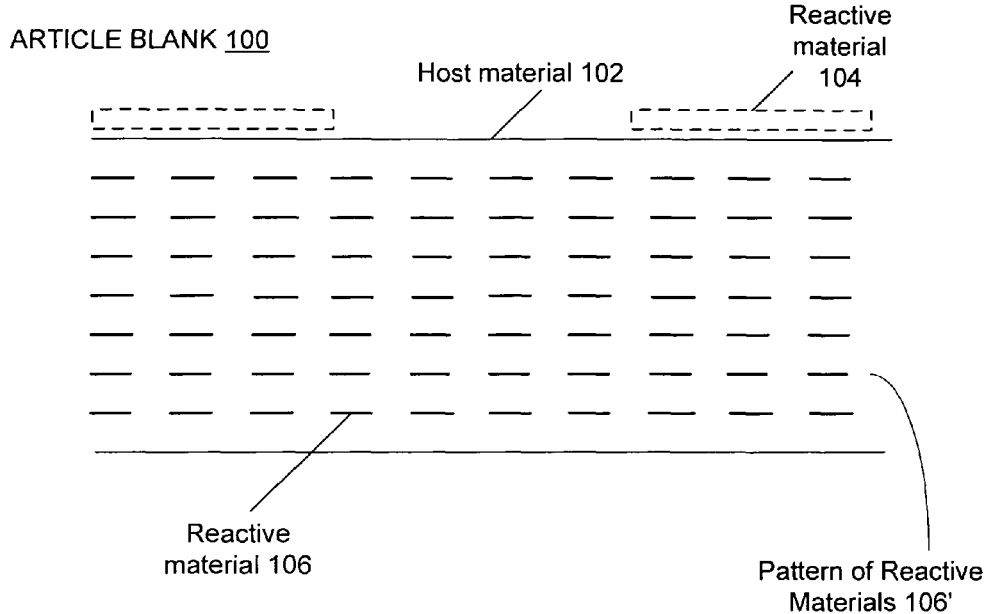
FIG. 1 is a schematic illustration of an exemplary optical component blank including reactive composite materials (RCM) arranged in a selected pattern, in accordance with the principles of the solutions described herein.

In the following description of exemplary embodiments, reference is made to the accompanying drawings, which form a part hereof. It will be understood that embodiments described herein are exemplary, but are not meant to be limiting. Further, it will be appreciated that the solutions described herein can be practiced or implemented by other than the described embodiments. Modified embodiments or alternate embodiments may be utilized, in the spirit and scope of the solutions described herein.

Devices and components, which can interact with or modify propagation of electromagnetic waves, are provided. The design, fabrication and structures of the devices exploit properties of reactive composite materials (RCM) and their reaction products.

The devices, examples of which are described herein, may be configured to interact with or modify propagation of electromagnetic waves in any part of the electromagnetic spectrum (e.g., visible, infrared, ultraviolet, X-rays, microwaves, radio waves, and other forms of electromagnetic radiation). For convenience in nomenclature, all such devices may be referred to hereinafter as "optical components," regardless of the particular wavelength(s) at which the devices operate or are configured to operate. Further, the devices may include devices whose interaction with electromagnetic waves is a direct function of the native electromagnetic properties (e.g., permittivity and permeability) of constituent materials in the device, and also devices whose interaction with electromagnetic waves is additionally a function of the properties resulting from artificial structuring of the constituent materials, inclusion of additional components or structures, or other configurations that produce an appropriate interaction with electromagnetic or other waves. For convenience in nomenclature, the latter type of devices may be referred to hereinafter as "metamaterial components." Metamaterial components having artificial structural elements may exhibit unusual properties (e.g., negative permittivity and/or permeability) at wavelengths that are, for example, several times larger than a spacing between the artificial structural elements in the components.

Metamaterials and their applications have been described, for example, in Pendry, et al., "Negative Refraction Makes a Perfect Lens", Phys. Rev. Lett. 85, 3966-3969 (2000), D. R. Smith et al., "Metamaterials and negative refractive index," Science, 305, 788 (2004), D. R. Smith et al., "Design and measurement of anisotropic metamaterials that exhibit negative refraction," IEICE Trans. Electron., E87-C, 359 (2004). While much of the discussion in such references relates to resonant structures, metamaterials may be implemented at more than one frequency or across a band of frequencies. All of the aforementioned publications are incorporated by reference in their entireties herein.

FIGS. 1-6 show exemplary optical and metamaterial component structures (100-600) that include RCM and/or RCM reaction products in or proximate to regions defining the components. The RCM may include reactive powdered materials (e.g., powder compacts or mixtures) disposed in binders (e.g., epoxy). Other exemplary RCM may include mechanically-shaped combinations of reactive materials including, for example, one or more of reactive metals, metal oxides, Ba, carbon and its compounds, Ca, Ce, Cr, Co, Fe, Hf, Mg, Mn, Mo, Nb, Ni, Si, Ta, Ti, Th, V, W, and Zr. Mo, Cu, Ti, Zr, Hf, V, Nb, Ta, Ni, Pd, Rh, Ni. Zr, B, C, Si, Al, $Fe_2O_3$, $Cu_2O$, $MoO_3$, FeCo, $FeCoO_x$, a carbide, a nitride, monel, an alloy, a metallic glass, or a metal ceramic.

The RCM assembled or incorporated in the components may have any suitable form (e.g., multilayers, islands, particles, nanofoils etc.). Further, any suitable fabrication method may be used to assemble or fabricate the RCM. The suitable method may include mechanical shaping (e.g., milling, machining, swaging, rolling, pressing, etc.) and/or physical and chemical deposition and etching (e.g., chemical vapor deposition, sputter deposition, etc.) Likewise, any suitable fabrication technique may be used to assemble or incorporate RCM in a component (e.g., in a host material of the component).

The type and shape of RCM incorporated in a component may be suitably selected, for example, in consideration of the contribution of the material properties of the RCM (and its products) to the component's electromagnetic behavior, and/or in consideration of the reactive properties of the RCM (e.g., heats of reaction, reaction self-propagation velocity, nature and form or reaction products). See e.g., M. E. Reiss, C. M. Esber, D. Van Heerden, A. J. Gavens, M. E. Williams, and T. P. Weihs, *"Self-propagating formation reactions in Nb/Si multilayers,"* Mater. Sci. Eng., A 261, 217 (1999), which is incorporated by reference in its entirety herein. The cited reference describes self-propagating formation reactions in Nb/Si multilayers and demonstrates that their reaction velocities decrease as the individual Nb and Si layers thicken.

Further, the type and shape of RCM incorporated in the incorporated in a component may be selected in consideration of the suitability of applicable reaction initiation methods (e.g., ignition by electrical spark, pressure, electromagnetic pulses etc.).

FIG. 1 shows an exemplary customizable optical component blank 100, which includes a host material 102 in a region defining the blank. The host material may be any suitable material (e.g., glass, epoxy, etc.), which is transparent, for example, at electromagnetic wavelengths selected for component operation. One or more RCM elements (102 and 106) are disposed in or proximate to the region defining the optical component blank. The RCM elements are disposed in a pattern 106' corresponding to one or more selectable optical component configurations that can be obtained by selectively reacting the RCM elements. At least one of the selectable optical component configurations may correspond to a transmissive optical component including, but not limited to a lens, a grating, a filter, a polarizer, a waveguide, an optical cavity, an optical interconnect, and/or an interferometer.

With reference to FIG. 1, a 2-dimensional pattern 106' of RCM elements 106, which have rectangular cross sectional shapes, is disposed in host material 102 of optical component blank 100. It will be understood that 2-dimensional pattern 106' shown in FIG. 1 is only exemplary. In general, RCM pattern 106' may have any suitable dimensions (e.g. 1-D, 2-D or 3D). Further, it will be understood that RCM elements 106 may have any suitable shape based, for example, on optical component design and customization considerations. For example, RCM element 106 may be a Ni/Si RCM nanofoil that has an increasing thickness along an axis with a view to have correspondingly decreasing reaction velocities along the axis. In general, RCM elements 106 may have any one or more dimensional, simple or complex shapes. Likewise, RCM elements 106 may have any suitable form. One or more RCM elements 106 may, for example, be in the form of layers, reactive nanofoils, islands, and/or particles disposed in the region defining the optical component.

One or more RCM elements 106 may be disposed in an interconnection region between two optical subregions in the optical component. Upon reaction, such RCM elements 106 may optically connect or disconnect the two optical subregions.

Optical component blank 100 may be configured so that a reaction can be started or initiated in selected portions of RCM pattern 106' (and/or proximate RCM elements 104) by any suitable technique (e.g., a spark or ignition pulse, an applied energy pulse, an optical energy pulse, applied pressure, etc.). A reaction that is started or initiated in a portion of RCM pattern 106' and/or RCM elements 104 may sustain itself by self-propagate to other portions of RCM pattern 106 in a controlled manner according to the structure and composition of the RCM.

The reaction may result in changes in the composition of blank 100. For example, a dielectric constituent may change into a metal, a metal may change into a dielectric material, and/or one dielectric constituent may change into another dielectric material upon reaction. Further, the reaction may result in changes in the structure of blank 100 due to, for example, differences in volumes of pre- and post-reacted RCM, and/or heat absorbed or generated in the reaction.

The changes in composition and structure of blank 100 upon reaction may be in the RCM constituents and/or the host material constituents. For example, the RCM reaction may generate exothermic heat (or absorb endothermic heat) to modify properties (e.g., dielectric properties) of host material portions adjoining the RCM. Further, for example, the RCM reaction may result in diffusion, mixing and/or chemical reaction of material species between the RCM and host material 110.

One or more optical properties of the region defining optical component blank 100 may be responsive to a reaction of the RCM therein. The optical properties that are affected or depend upon a state of the RCM (e.g., reacted or unreacted) include, for example, a permittivity, an index of refraction, an absorption coefficient, a spectral property, a transmission property, or an optical confinement property of the region. The property may be an RF, MW, THz, IR, visible, and/or UV property. Likewise, one or more mechanical or structural properties (e.g., shape, size, elasticity, volume, density, and/or crystallinity) of optical component blank 100 may be responsive to a reaction of the RCM therein.

An optical component formed selectively customizing optical component blank 100 may be a transmissive optical component. Further, the optical component may include simple or complex optical devices or structures (e.g., a lens, a grating, a waveguide, an optical cavity, an optical interconnect, a filter, a polarizer, an interferometer, etc.), which may operate at one or more selected electromagnetic wavelengths.

Figure 2:
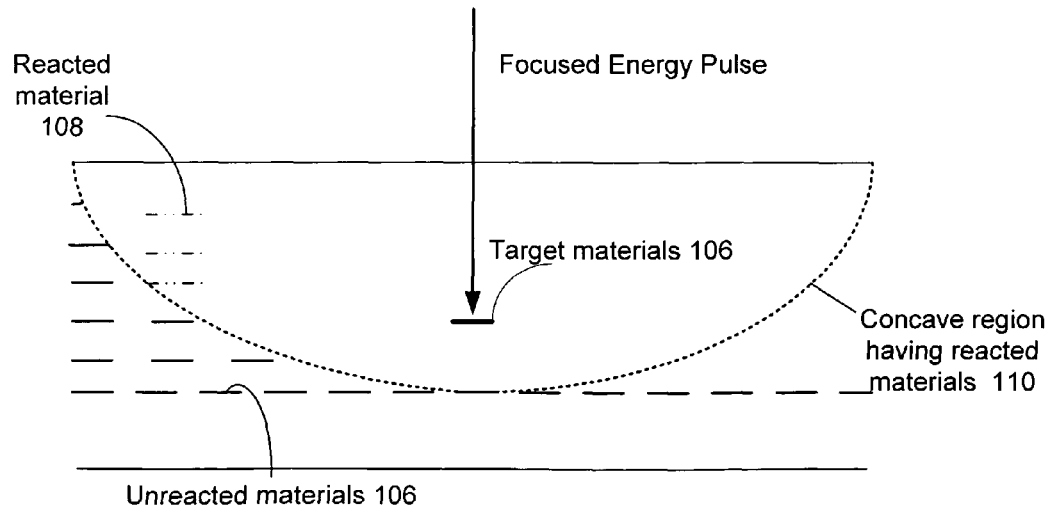
FIG. 2 is a schematic illustration of an exemplary customized optical component fabricated, for example, selectively reacting the RCM in the optical component blank of FIG. 1, in accordance with the principles of the solutions described herein.

FIGS. 2 and 3 show exemplary optical components that may be obtained by selectively reacting RCM elements 106 in optical component blank 100. FIG. 2 shows, for example, an optical component 200 having a plano lens-like structure obtained by selectively reacting RCM elements 106 in a concave region 110 of blank 100. A reaction in a RCM element 106 in a concave region 110 may be initiated by selectively applying energy pulses, sparks, or pressure to blank 100. FIG. 2 shows for example, an energy pulse focused to a selected depth to initiate a reaction in a target RCM element 106. FIG. 2 also schematically shows reacted material 108 resulting from reaction of target RCM elements 106 in region 110. It will be understood that reacted material 108 as shown schematically in FIG. 2 represents material and/or structural changes in both RCM and host material in region 110.

Like FIG. 2, FIG. 3 shows an optical component 300, which may be obtained from blank 100 by selectively reacting portions of RCM pattern 106' and/or proximate RCM elements 104. Optical component 300, for example, includes optical interconnect 302 between two optical subregions 304, an optical cavity 306, a polarizer 310 and a filter 312. The optical devices or structures may be characterized or defined by either unreacted RCM elements or reacted RCM elements. For example, interconnect 302, which operates to optically interconnect subregions 304 at one or more electromagnetic wavelengths, may be formed by an unreacted RCM element 106 as shown, for example, in FIG. 3. Alternatively, interconnect 302 may be formed of reaction products 108. In general, reaction product material 108 may optically connect or disconnect two optical subregions. In some instances, reaction product material 108 may merely attenuate an optical link between two optical subregions.

The optical devices or structures obtained by selectively reacting RCM in optical blank 100 may be characterized or defined by either unreacted RCM elements and/or reacted RCM elements. For example, optical cavity 306 ends may be unreacted RCM elements 106 as shown in FIG. 3. Further for example, polarizer 310 may include unreacted proximate RCM element 104, and filter 312 may include reaction products of a proximate RCM element 104 and host material 102.

It will be understood that blank 100 may also include pre-formed devices or devices structures (not shown) that are in addition to RCM elements 106. These preformed devices and device structures may be independent of devices structures formed by reacting RCM elements 106. Additionally or alternatively, the preformed devices and device structures may be modified by selectively reacting RCM elements 106.

The RCM reaction products and/or host material reaction products (e.g., reaction products 108 and filter 312) may include a reaction product of one or more of reactive metals, metal oxides, Ba, carbon and its compounds, Ca, Ce, Cr, Co, Fe, Hf, Mg, Mn, Mo, Nb, Ni, Si, Ta, Ti, Th, V, W, and Zr. Mo, Cu, Ti, Zr, Hf, V, Nb, Ta, Ni, Pd, Rh, Ni. Zr, B, C, Si, Al, $Fe_2O_3$, $Cu_2O$, $MoO_3$, FeCo, $FeCoO_x$, a carbide, a nitride, monel, an alloy, a metallic glass, or a metal ceramic. The reaction product(s) may be disposed in a multi-dimensional pattern in the region defining the optical component (e.g., component 200 and 300).

One or more optical properties of an optical component formed by customizing blank 100 by selectively reacting RCM therein are a function of the reaction product material left in the component. An optical property may, for example, be a permittivity, an index of refraction, an absorption coefficient, a conductivity, a magnetic susceptibility, a spectral property, a transmission property, or a reflection property of the region defining the component. The optical property may be a RF, MW, THz, IR, visible, and/or UV property. Further, mechanical and or structural properties (e.g., shape, elasticity, size, density, crystallinity, etc.) of the optical component are a function of the reaction product material left in the component.

Figure 4:
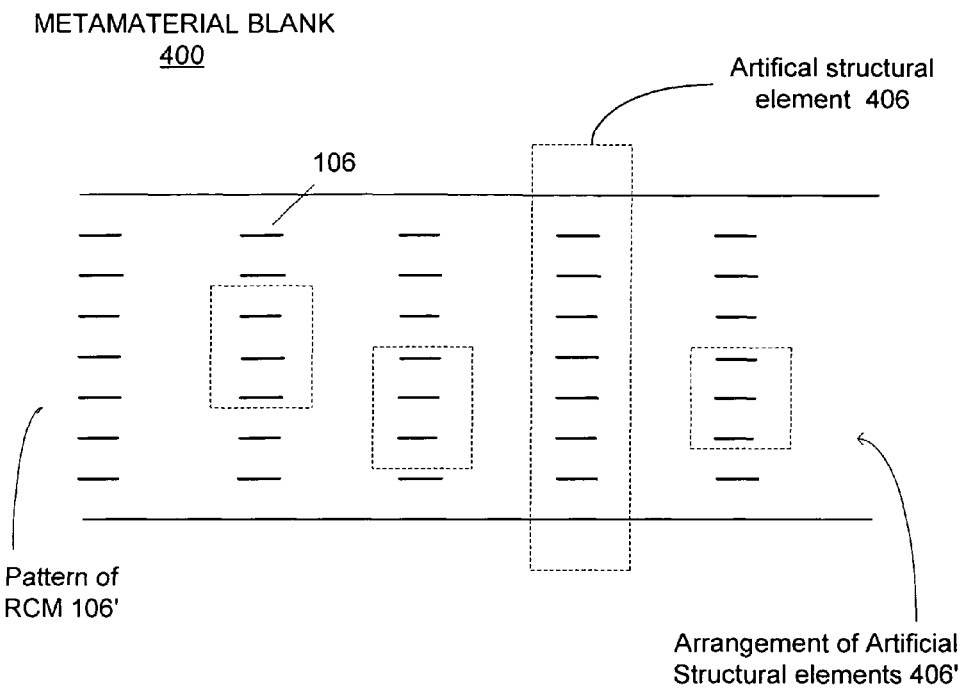
FIG. 4 is a schematic illustration of an exemplary metamaterial component blank having a selected arrangement of artificial structural elements that include selected patterns of RCM, in accordance with the principles of the solutions described herein.
Figure 6:
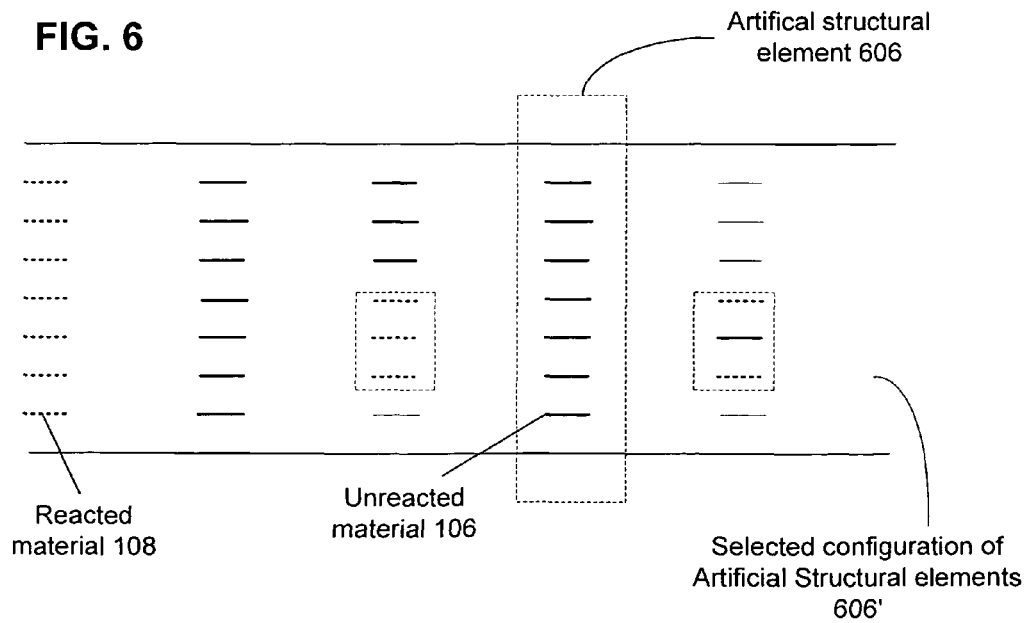
FIG. 6 is a schematic illustration of an exemplary customized metamaterial component fabricated, for example, selectively reacting the RCM in the metamaterial component blank of FIG. 4, in accordance with the principles of the solutions described herein.

Attention is now directed to metamaterials. FIGS. 4-6 show an exemplary metamaterial component blank 400, an exemplary RCM distribution 500 corresponding to a metamaterial device 500', and an exemplary metamaterial component 600, respectively.

Many structures and systems incorporating metamaterials employ discrete components (e.g., split ring resonators, oscillators, transmission lines, Swiss rolls, nanorods, fishnets, or similar structures). A range of illustrative metamaterial structures can be found in Christophe Caloz, Tatsuo Itoh, "Electromagnetic Metamaterials: Transmission Line Theory and Microwave Applications," ISBN: 0-471-66985-7, November 2005, Wiley-IEEE Press, G. V. Eleftheriades, K. G Balmain, "Negative-Refraction Metamaterials: Fundamental Principles and Applications," ISBN: 0-471-74474-3, August 2005, and V. M. Shalaev, "Optical Negative-Index Metamaterials," Nature Photonics, pp 41-48, Vol 1, January 2007. Further, commonly owned United States Patent Application publication No. 20070188385 A1 describes a variable metamaterial apparatus. All of the aforementioned publications and patent application are incorporated by reference in their entireties herein.

Exemplary metamaterial component blank 400, RCM distribution 500, and metamaterial component 600 may include or correspond to any of the illustrative metamaterial structures that are described in the incorporated references or other metamaterial structures.

With reference to FIG. 4, exemplary metamaterial component blank 400 includes a pattern 106' of RCM elements 106 disposed in or proximate to a region defining a metamaterial component. Pattern 106' of RCM elements 106 corresponds to one or more selectable metamaterial component configurations 406' of artificial structural elements 406. RCM elements 106 may include RCM having any suitable composition, shape or form (e.g., nanofoils, multilayers, islands, particles, etc.) Artificial structural elements 406 may include at least one structural element having a dimension that is similar to or less than a selected wavelength at which a selected metamaterial component configuration exhibits metamaterial properties. The selected wavelength at which a selected metamaterial component configuration exhibits metamaterial properties may be in any part of the electromagnetic spectrum (e.g., a wavelength in the RF, MW, THz, IR, visible, or UV ranges of the electromagnetic spectrum). The artificial structural elements may include any suitable metamaterial component or part thereof (e.g., split ring resonators, oscillators, transmission lines, Swiss rolls, or similar structures).

RCM elements 106, which are disposed in metamaterial component blank 400, may correspond to all or any part of a metamaterial component or adjoining portions thereof. For example, when the metamaterial component is a split ring resonator, RCM elements 106 may correspond to all or part of a split ring, to portions between or adjoining the split rings, and/or to structures below or above a plane containing a split ring. FIG. 5 shows, for example, an exemplary disposition of RCM elements 106A, B and C corresponding to metamaterial component device 500, which is a split ring resonator having inner and outer annular split rings. It will be noted that RCM elements 106 in metamaterial component blank 400 may be of different types (e.g. RCM elements 106A, B and C).

Like the RCM elements 106 optical component blank 400, RCM elements in metamaterial component blank 400 may be selectively applying energy pulses, sparks, and/or pressure to blank 400 to initiate a controlled reaction (e.g., a self-propagating reaction) therein. Like a RCM reaction in optical blank 100, the reaction in blank 400 may result in changes in the composition of blank 400. For example, a dielectric constituent may change into a metal, a metal may change into a dielectric material, and/or one dielectric constituent may change into another dielectric material upon reaction. For example, with reference to FIG. 5, RCM element 106A may change from a metal into a dielectric, RCM element 106B may change from dielectric to a metal, and RCM element 106C may change from one dielectric to another dielectric. Further, the reaction may result in changes in the structure of blank 400 due to, for example, differences in volumes of pre- and post-reacted RCM and adjoining portions, and/or heat absorbed or generated in the reaction.

Physical (including in some cases electromagnetic), mechanical, and material properties (e.g., a permittivity, an index of refraction, anisotropy, an absorption coefficient, a gain, a conductivity, a magnetic susceptibility, a spectral property, a transmission property, or a reflection property, shape, size, crystallinity, etc.) of metamaterial component blank 400 may depend on a reaction state (e.g., reacted or unreacted) of the RCM. Accordingly, a metamaterial property exhibited by metamaterial component blank 400 at a selected electromagnetic wavelength can be a function of the reaction state of the RCM therein. RCM elements 106 in metamaterial component blank 400 may be selectively reacted to obtain a selected configuration 406' of artificial structure elements 406 that gives rise to a particular metamaterial property.

FIGS. 5 and 6 show exemplary metamaterial components/devices that may be obtained by selectively reacting RCM elements 106 in metamaterial component blank 400 to make material and/or structural changes in both RCM and/or host material regions of metamaterial component blank 400. The exemplary metamaterial components/devices include particular arrangements of artificial structural elements with at least one artificial structural element having a dimension that is less than a selected wavelength (e.g., a wavelength in the RF, MW, THz, IR, visible, or UV ranges of the electromagnetic spectrum) at which the component/devices exhibit metamaterial properties.

FIG. 5 shows exemplary split ring resonator device 500' that may be obtained, for example, by reacting RCM element 106A, 106B and 106C in distribution 500. Further, FIG. 6 shows exemplary metamaterial component 600 having a particular configuration 606' of artificial structural elements 606 that may be obtained by selectively reacting RCM elements 106 in metamaterial component blank 400. The particular configuration or arrangement 606' of artificial structural elements 606 may include only reacted materials 108, unreacted materials 106, or both, in addition to host materials which may be present in metamaterial component blank 400.

In both device 500' and 600, the particular arrangement of artificial structural elements gives rise to metamaterial properties of the metamaterial component. The particular arrangement of artificial structural elements includes reaction product material resulting from selectively reacted RCM disposed in or proximate to a region defining the metamaterial device or component and/or unreacted RCM material. The reaction product material resulting from selectively reacted RCM may, for example, alter pre-existing artificial structural elements in the region defining the metamaterial component, dielectric properties of an adjoining artificial structural element, and/or a volume occupied by the RCM.

Like in optical components 200 and 300, RCM and/or host material reaction products in metamaterial device 500' and component 600, may include a reaction product of one or more of reactive metals, metal oxides, Ba, carbon and its compounds, Ca, Ce, Cr, Co, Fe, Hf, Mg, Mn, Mo, Nb, Ni, Si, Ta, Ti, Th, V, W, and Zr. Mo, Cu, Ti, Zr, Hf, V, Nb, Ta, Ni, Pd, Rh, Ni. Zr, B, C, Si, Al, $Fe_2O_3$, $Cu_2O$, $MoO_3$, FeCo, $FeCoO_x$, a carbide, a nitride, monel, an alloy, a metallic glass, or a metal ceramic. The reaction product(s) may be disposed in a multi-dimensional pattern in the region defining the metamaterial device or component.

Methods for making optical and/or metamaterial devices and components may involve RCM materials. FIGS. 7 and 8 show exemplary methods 700 and 800 for making optical and metamaterial components, respectively.

FIG. 7 shows exemplary method 700 making an optical device or component based on RCM materials. Method 700 includes providing a host material in a region defining an optical component (710), providing RCM in or proximate to the region defining the optical component (720) and altering optical properties of the region by selectively reacting a portion of the RCM in or proximate to the region (730). The region may define a transmissive optical component. Further, the optical component may, for example, be a lens, a grating, a waveguide, an optical cavity, a polarizer, a filter, an optical interconnect, and/or an interferometer.

In method 700, altering optical properties of the region involves by selectively reacting a portion of the RCM according to a selected design or pattern for customizing the optical component. The altered optical properties may, for example, include a permittivity, an index of refraction, an absorption coefficient, a spectral property, a transmission property, and/or an optical confinement property of the region. Further, reacting the RCM may alter mechanical and structural properties (e.g., shape, elasticity, density, crystallinity, volume or size) of the RCM and adjoining host material. The altered properties may be a RF, MW, THz, IR, visible, and/or UV property of the region.

Selectively reacting a portion of the RCM in or proximate to the region may involve initiating a self-propagating reaction in the RCM, for example, by applying a spark, an energy pulse, focusing energy to a selected depth in the region defining the optical component, and/or applying pressure. The reaction in the RCM may change a dielectric material into a metal or another dielectric material, and/or change a metal into a dielectric material or other conductor.

Further, in method 700, selectively reacting a portion of the RCM may generate exothermic heat (and/or absorb endothermic heat), which modifies properties (e.g. dielectric properties) of portions adjoining the RCM in the region. The modification may be because of heat transfer, and/or mixing or reaction of material species changing properties of portions adjoining the RCM in the region.

The RCM used in method 700 may include, for example, reactive metals and/or metal oxides, Ba, carbon and its compounds, Ca, Ce, Cr, Co, Fe, Hf, Mg, Mn, Mo, Nb, Ni, Si, Ta, Ti, Th, V, W, and Zr. Mo, Cu, Ti, Zr, Hf, V, Nb, Ta, Ni, Pd, Rh, Ni. Zr, B, C, Si, Al, $Fe_2O_3$, $Cu_2O$, $MoO_3$, FeCo, $FeCoO_x$, a carbide, a nitride, monel, an alloy, a metallic glass, or a metal ceramic. The RCM may be in any suitable form (e.g., as a multi-dimensional pattern, a multilayered structure, particles, islands, and/or reactive nanofoils).

In some implementations of method 700, disposing RCM may include disposing RCM in an interconnection region between two optical subregions in the optical component. The RCM disposed in the interconnection region may be responsive to optically connect or disconnect the two optical subregions upon reaction.

FIG. 8 shows an exemplary method 800 making a metamaterial device or component based on RCM materials. Method 800 may include disposing a plurality of RCM in or proximate to a region defining the metamaterial component (810), and forming a particular arrangement of artificial structural elements by selectively reacting the RCM so that the region exhibits metamaterial properties related to the particular arrangement of artificial structural elements (820).

At least one artificial structural element may have a dimension that is similar to or less than a selected wavelength (e.g., a wavelength in the RF, MW, THz, IR, visible, or UV ranges of the electromagnetic spectrum) at which the region exhibits metamaterial properties.

In method 800, forming a particular arrangement of artificial structural elements may involve forming adjoining structural elements having at least one different physical property (e.g. a permittivity, an index of refraction, an absorption coefficient, a conductivity, a magnetic susceptibility, a compositional property, a spectral property, a transmission property, or a reflection property) and may involve altering pre-existing artificial structural elements in the region.

Further in method 800, the types and/or forms of RCM used may be the same or similar to types and/or forms of RCM, which have been previously described herein (e.g., with reference to FIGS. 1-7). Likewise, in method 800 the techniques or processes for selectively reacting the RCM and results of the reaction may be the same or similar to those previously described herein (e.g., with reference to FIGS. 1-7).

While various aspects and embodiments have been disclosed herein, other aspects and embodiments will be apparent to those skilled in the art.

Figure 10:
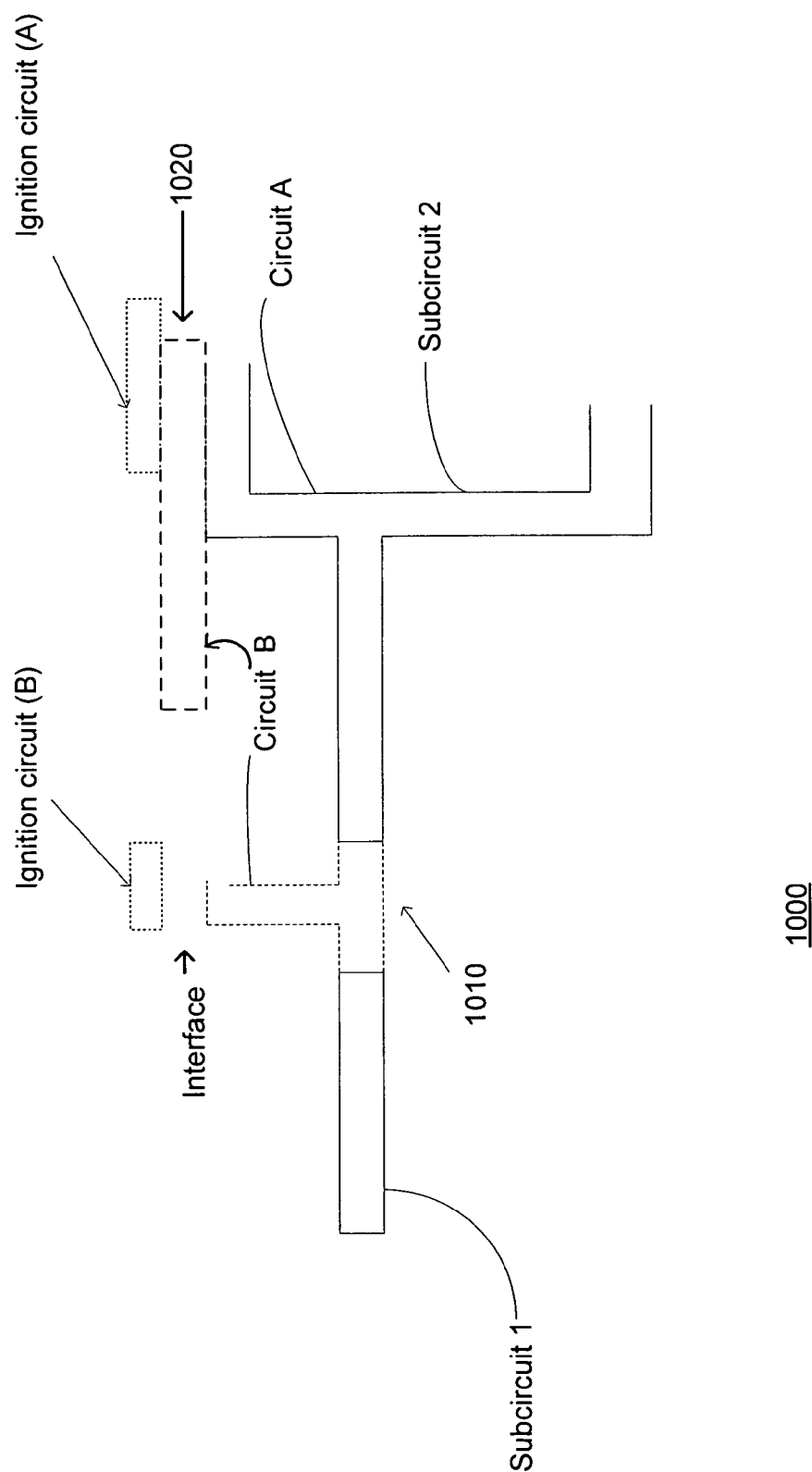
FIG. 10 is another schematic illustration of an exemplary article blank including multiple reaction-propagation pathways or circuits made of reactive composite materials (RCM), in accordance with the principles of the solutions described herein.
Figure 11:
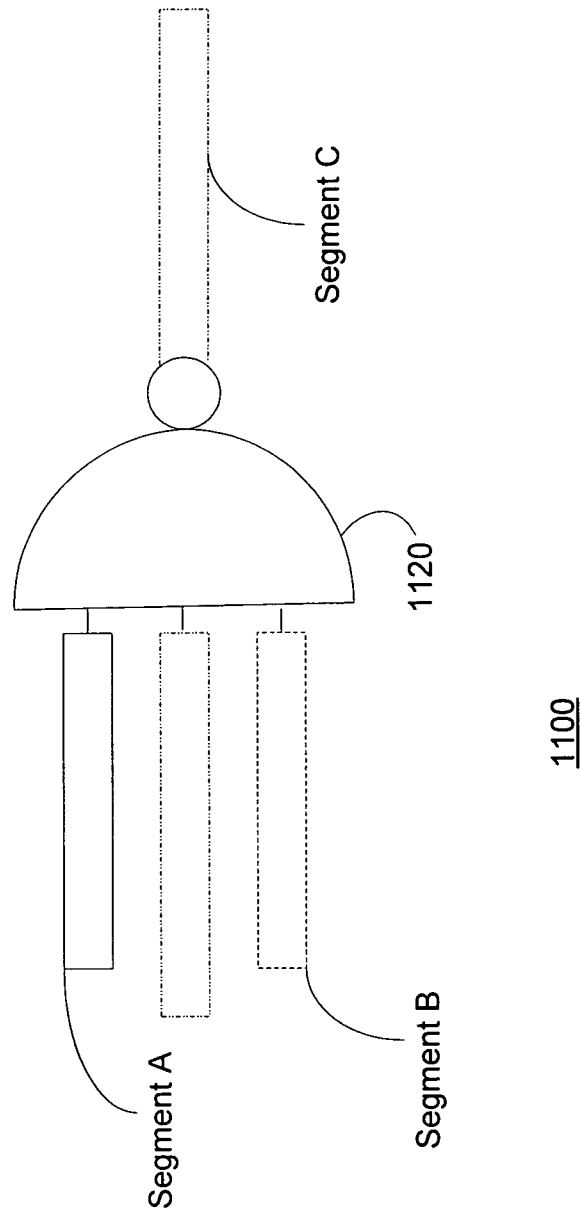
FIG. 11 is a schematic illustration of an exemplary reaction-propagation NAND gate, in accordance with the principles of the solutions described herein.

FIGS. 9-11 show, for example, article blanks (900-1100), which include a RCM circuit disposed in selected patterns that provide multiple reaction-propagation pathways or circuits to modify select portions of the article blanks. Like article blanks 100-500 described with reference to FIGS. 1-5, article blanks 900-1100 may be used to fabricate custom articles or devices (e.g., structural, optical, electronic and/or metamaterial devices) by reacting RCM and/or host materials therein. The multiple reaction-propagation pathways or circuits may provide users with one or more ways to control or customize the articles or devices made from the article blanks.

A RCM circuit in an article may include a first arrangement of one or more RCM segments (A) providing a first reaction-propagation pathway to a region in the article, and a second arrangement of one or more RCM segments (B) providing a second reaction-propagation pathway the same region in the article. The first and second reaction-propagation pathways may be geometrically distinct. Material properties (e.g., energy flow, material flow, and/or reaction propagation characteristics) of a RCM segment in any of the reaction-propagation pathways may depend on the state of the reactive materials in the segment. The energy flow through or across a RCM segment may include electrical, thermal, material, chemical, acoustic, and/or optical energy.

The segments may provide a link between and/or to the device elements in the article. The segments may be laterally patterned and may be disposed in multi-dimensional arrangements. At least one pair of segments A and B differ in at least one of material composition, segment dimensions, reaction energy release, reaction propagation speed, or reaction ignition or burn characteristics.

The RCM circuit may be coupled to a circuit-customization interface configured to receive energy stimuli to selectively ignite a reaction in one or more selected segments A and/or B according to a selected circuit design. The circuit-customization interface may include one or more independently acting ignition circuits configured to ignite reactions in a segment A and/or B at the same or different times. An ignition circuit may, for example, be one of an electrical circuit, an optical circuit, an induction circuit, or a combination thereof. The action of an ignition circuit on a RCM segment in one circuit pathway (e.g., in a segment A) may be responsive to a reaction in the other circuit pathway (e.g., in a segment B). The response may be one of an ignition-enabling or ignition-inhibiting action. A segment (e.g., segment A) may respond to a reaction in another segment (e.g., segment B) by undergoing a reaction and/or a change in reactive properties (e.g., reaction propagation speed and/or reaction ignition threshold) of the materials in itself. The change in the reactive properties of the responsive segment may block, or conversely, enable reaction propagation in the responsive segment.

FIG. 9 shows article blank 900, which includes geometrically distinct RCM circuits A and B. Circuits A and B provide different reaction propagation pathways to regions of article blank 900, for example, to region 902. Region 902 can be modified for article 900 customization by RCM reactions propagating on circuit A and/or circuit B. The RCM reactions for modifying region 902 may propagate, for example, on circuit A along directions 901 and/or 901'. Likewise the RCM reactions for modifying region 902 may propagate on circuit B along directions 903 and/or 903'.

Circuits A and B may be disposed in any suitable pattern (e.g., 2-d or 3-d pattern) in article blank 900. For example, circuits A and B may be laterally patterned RCM circuits on a common substrate. Circuits A and B in article blank 900 may be made of materials having different geometrical, physical and chemical characteristics. For example, circuits A and B may differ from each other in layer thicknesses, energy release, reaction propagation speed, ignition and/or other burn characteristics.

Portions of circuits A and B in article blank 900 may be adjacent or overlapping (e.g., as in region 902 and 906, respectively). Circuits A and B may be configured so that operation of one RCM circuit modifies performance of the other RCM circuit. However, circuits A and B may have asymmetric mutual ignition properties so that at adjacent or proximate or proximate portions one circuit (e.g., circuit A) can ignite the other circuit (e.g., circuit B), but not vice-versa.

Further, proximate portions of circuits A and B may be separated by one or more reaction isolation materials to prevent ignition of one by reactions propagating on the other. For example, with reference to FIG. 9, reaction isolation material or stop layer 908 is disposed between proximate segments of circuits A and B in region 904. Stop layer 908 may, for example, include inert material, electrically insulating material, thermally insulating material, heat sink material, endothermic material and/or any combination thereof. The materials in stop layer 908 may be selected to inhibit energy and/or material flow between adjoining segments A and B. A suitable stop layer may respond to energy stimulus by undergoing an endothermic reaction of materials therein. In general, any RCM segment in one circuit pathway may be substantially independent of, or non-responsive to, a reaction in any segment in the other circuit pathway.

Circuits A and B may be configured so that they can be individually ignited at different times. The circuits may be ignited by physically-different or switchably-different ignition circuitry (optical, electrical, induction, etc.). For example, article 900 blank includes physically-different ignition circuits A and B for independently initiating reactions in RCM circuits A and B, respectively.

Circuits A and B may be configured so that operation of one RCM circuit modifies performance of the other RCM circuit. FIG. 10 shows, for example, an article blank 1000 in which a RCM segment B 1010 is interposed between two sub-circuits (A). The interposed segment B may have selected reactive properties that allow or inhibit propagation of a reaction from one sub-circuit to the second sub-circuit (A), for example, according to whether it is in an unreacted or reacted state, respectively. The RCM in segment 1010 may be selected so that a reaction therein can result in reaction products or other material changes that thermally, physically, or chemically decouple the two subcircuits (A). Thus, a reaction in segment 1010 may block reaction propagation through circuit A. Conversely, the RCM in segment 1010 may be selected so that a reaction in segment 1010 can result in reaction products or other material changes that thermally, physically, or chemically couple the two subcircuits (A). Thus, a reaction in segment 1010 may enable reaction propagation through circuit A.

FIG. 10 also shows, for example, a RCM segment B 1020 is interposed between circuit A and its associated ignition circuit A. Like segment 1010, a reaction in segment 1020 may result in reaction products or other material changes that decouple (or conversely couple) ignition circuit (A) from circuit A. Thus, a reaction in segment 1020 of circuit B may block (or allow) the ignition circuitry from igniting a reaction in circuit A.

In general, the RCM circuits may be configured so that reaction-propagation on one circuit does not ignite a reaction on the other circuit, but merely modifies reaction-propagation on the other circuit by modifying material properties of the other circuit. For example, a reaction in circuit A may lead to a change in reaction-propagation speed, ignition threshold and/or burn characteristics of adjacent, overlapping or proximate segments of circuit B.

Multiple RCM circuits may be disposed in an article blank in selected patterns that include logic-like elements for reaction propagation on the circuits. FIG. 11 schematically shows an exemplary RCM NAND gate 1120. A pair of RCM segments A and B may be configured as inputs, and a segment C is configured as output of NAND gate 1100. The NAND gate reactive materials may be suitably selected so that reaction propagation in segment C is inhibited or blocked only upon reactions in both segment A and segment B. For example, the gate reactive materials may be selected so that RCM segments A and B (e.g., of circuits A and B) are required to act together to ignite a firebreak section in segment C (of a third circuit C). A reaction in only one RCM segment A or B may not sufficient to ignite the firebreak.

Methods for making articles based on use of reactive materials may involve using alternate RCM pathways to modify properties of regions in the articles. FIG. 12 shows an exemplary method 1200 making articles using alternate RCM pathways or circuits to modify properties of a region. Method 1200 includes providing a first set of reactive material segments (A) forming a first reaction-propagation pathway to the region (1210), and a second set of reactive material segments (B) forming an alternate second reaction-propagation pathway to the region (1220). At least one pair of segments A and B may differ in at least one of material composition, segment dimensions, reaction energy release, reaction propagation speed, reaction ignition, or burn characteristics. A segment A may respond to a reaction in another segment B by undergoing a reaction itself, or by a change in its reactive properties. The change in the reactive properties may either enable or block a reaction in the segment A.

The sets of reactive material segments may also include at least one segment that is substantially independent of, or non-responsive to, a reaction in any other segment Method 1200 may further include providing one or more reaction-isolation elements that are configured to inhibit energy and/or material flow between adjoining or proximate segments A and B. The reaction-isolation elements may include suitable inert material, electrically insulating material, heat sink material, thermally insulating material, endothermic material or any combination thereof. Method 1200 may include providing a segment B interposed between two sub-circuits of segments A. The interposed segment B may have selected reactive properties that allow or inhibit propagation of a reaction across it according to its reaction state (e.g., an unreacted or a reacted state).

Method 1200 also includes providing a circuit-customization interface configured to receive stimuli to selectively ignite a reaction in one or more selected segments A and/or B according to a selected article design (1230). The interface may include one or more independently acting ignition circuits configured to initiate reactions in segments A and/or B. The reactions in one or more selected segments A and/or B may be selected to modify properties of the region. The reactions in one or more selected segments may be initiated at different times. In general, the reactions in selected segments A and/or B may be used to connect or disconnect particular device elements in the article (e.g., passive devices, active devices, device terminals, posts or ports, resistors, capacitors, inductors, optical devices, electronic devices, microwave devices, rf devices, liquid crystal devices, mechanical devices and/or electromagnetic devices).

Method 1200 may further include providing a third set of RCM segments C and configuring at least one segment A and one segment B as inputs to a reaction-propagation NAND gate having a segment C as its output.

Figure 13:
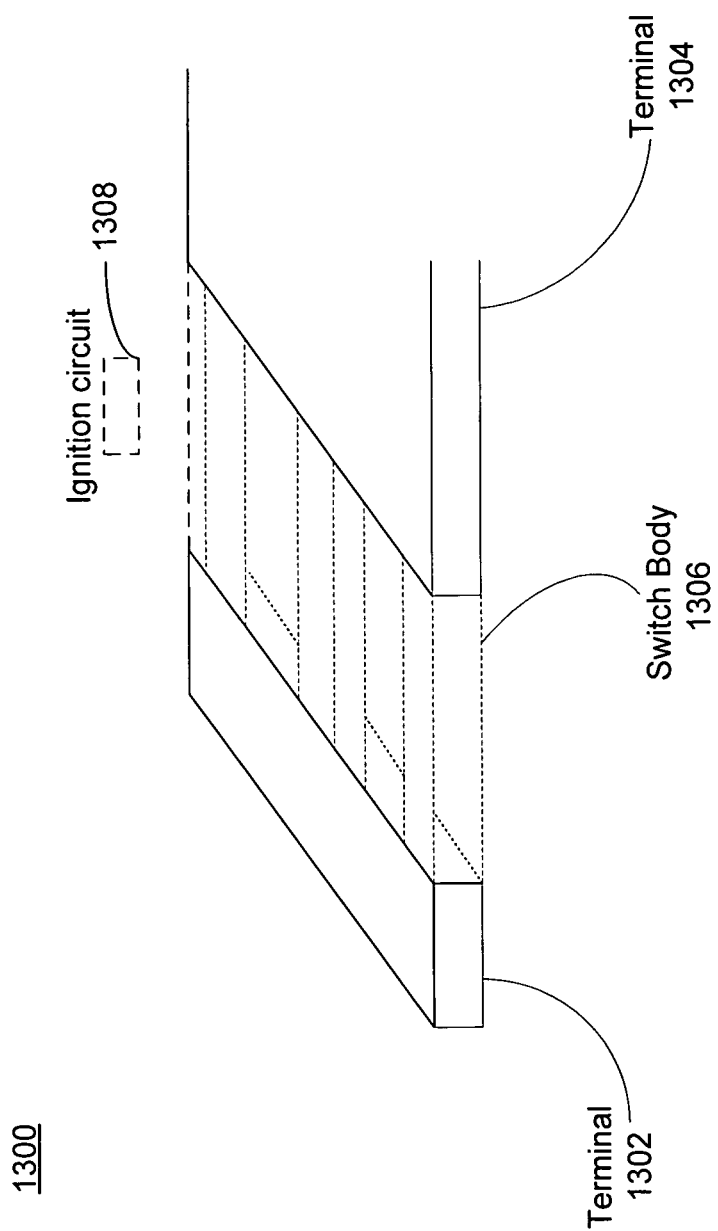
FIG. 13 is shows an exemplary electrical closing switch made from RCM materials, in accordance with the principles of the solutions described herein.
Figure 14:
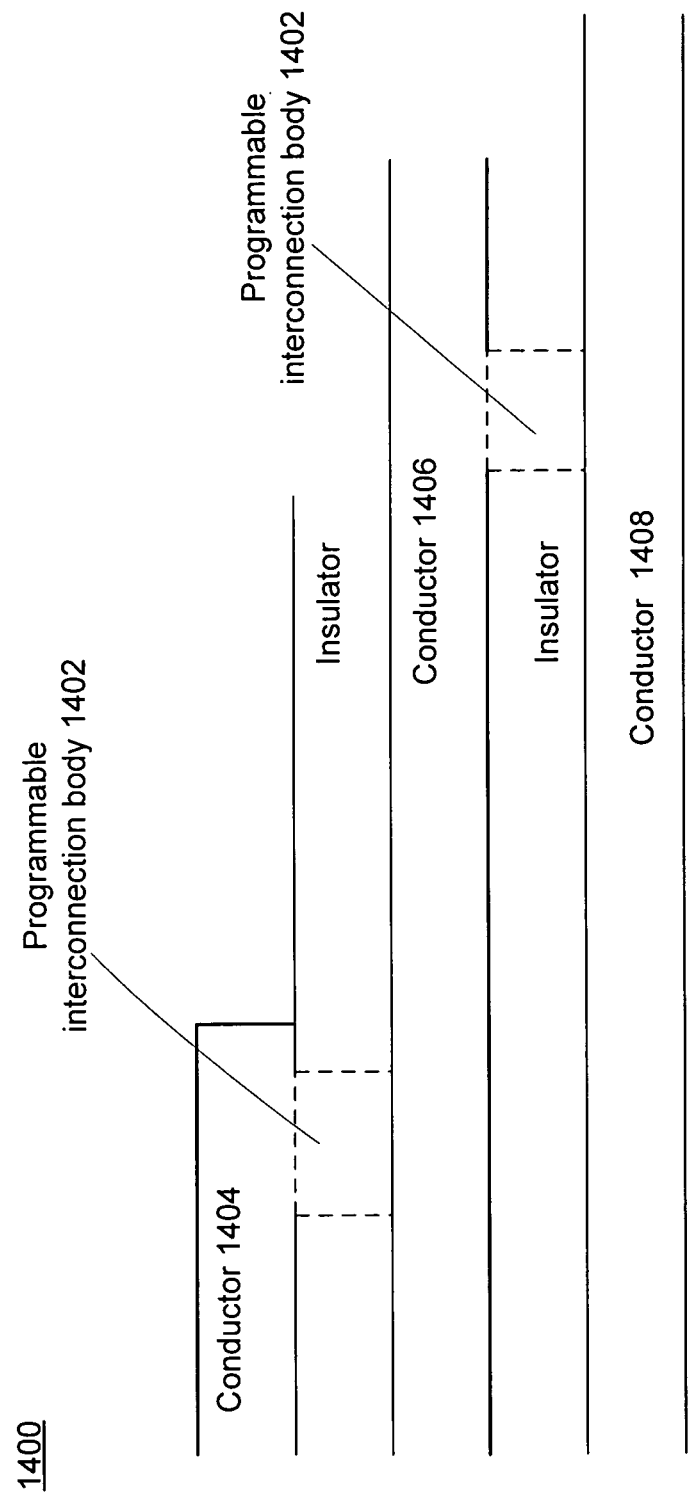
FIG. 14 is a schematic illustration of an exemplary electrical circuit having one or more programmable RCM interconnections, in accordance with the principles of the solutions described herein.

Attention is now directed to the use of RCM in switching devices and electrical interconnections (FIGS. 13-15).

An exemplary switch includes a programmable RCM body (e.g., electrically, thermally or optically programmable body) extending between two conductors. The programmable RCM body has non-conducting and conducting states or impedances corresponding to pre-reaction and post-reaction states, respectively, of the materials therein. The programmable RCM body may be coupled to a programmable/ignition circuit, which allows users to control switch closing impedances by selecting particular firing or reaction patterns in the programmable RCM body.

FIG. 13 shows an exemplary electrical closing switch 1300 made from RCM materials. Closing switch 1300 includes one or more reactive switch bodies 1306 disposed in pattern between switch terminals 1302 and 1304. Switch bodies 1306 may be made from suitable RCM that are dielectrics or insulators in an unreacted state, but are reaction products conductive (e.g., metals) in a reacted state.

Switch 1300 has an "open" non-conducting state and a "closed" conducting state corresponding to a pre-reaction state and a post-reaction state, respectively, of the reactive composite materials in switch bodies 1306. In both its open non-conducting and closed conducting states, the switch impedances are a function of the physical properties of the materials in switch bodies 1306. In an open switch condition, electrical current flow between terminals 1302 and 1304 may be blocked or impeded by a high impedance of the unreacted dielectric or insulating RCM in switch bodies 1306. In a closed switch condition, electrical current flow between terminals 1302 and 1304 may be enabled by a low impedance of the conductive reaction products in switch bodies 1306 between the terminals.

Terminals 1302 and 1304 may, for example, be is a capacitor plate and a grounding conductor, respectively. Thus, switch 1300 may be configured to discharge the capacitor plate in the RCM body's reacted state. Alternatively, terminals 1302 and 1304 may, for example, be oppositely charging plates of a capacitor, and switch 1300 may be configured to short the capacitor in the RCM body's reacted state.

Switch 1300 may be configured to be moved from an open condition to a closed condition by igniting reactions in switching bodies 1306. For this purpose, switch bodies 1306 may be coupled to an ignition circuit 1308. Ignition circuit 1308 may, for example, be an electrical circuit, an optical circuit, an induction circuit, or a combination thereof. Further, ignition circuit 1308 may be configured to ignite reactions in one or more switching bodies 1306 in a suitable firing pattern. The suitable firing pattern may be user selected to control or achieve particular impedances in the switch closing transition.

FIG. 14 shows an exemplary electrical circuit 1400 having one or more programmable RCM interconnections 1402 disposed between conducting elements 1404-08. Electrical circuit 1400 may, for example, be a layered 2-d or 3-d integrated circuit and RCM interconnections 1402 may be laterally patterned RCM segments. Conducting elements 1404-08 may, for example, provide electrically conductive pathways between other circuit elements (e.g., transistors, capacitors, resistors, capacitors, and inductors) (not shown). RCM interconnections 1402, like switch bodies 1306, may be made from insulating or dielectric RCM that can react to form low resistance products (e.g., metals). RCM interconnections 1402 may, for example, be reactive multilayered materials placed in a via in an insulating layer.

Further, like switch bodies 1306, RCM interconnections 1402 may have non-conducting states and conducting states corresponding to pre-reaction and post-reaction states, respectively, of the reactive composite materials therein.

A programming/ignition interface 1401, which can be coupled to electrical circuit 1400, is configured to provide energy stimuli (e.g., electrical, optical, and/or thermal) for initiating resistance-changing reactions in selected interconnections 1402. In operation, the particular interconnections 1402 that are reacted may be user-selected according to a custom circuit design.

It will be understood that the dimensions and arrangement of RCM switch bodies 1306 and RCM interconnection 1402 in switch 1300 and circuit 1400 shown in FIGS. 13 and 14, respectively, are only exemplary. In general, switch bodies 1306 and RCM interconnection 1402 may have any suitable dimensions, shapes and material compositions based, for example, on circuit design and customization considerations.

FIG. 15 shows an exemplary method 1500 for controllably or programmably interconnecting two conductors. Method 1500 includes providing a programmable RCM body extending between the two conductors. The programmable RCM body may include reactive multilayered materials that have dielectric properties in a pre-reaction state and include one or more metals or other conductive materials in the post-reaction state. The programmable RCM body may have a non-conducting state and a conducting state corresponding to a pre-reaction state and a post-reaction state, respectively, of the reactive composite materials therein. The programmable RCM body may be electrically, optically, or thermally programmable.

Method 1500 further includes controllably igniting or initiating a reaction in the programmable RCM body to make it conductive (1520). Method 1500 may include controlling a firing or reaction pattern in the programmable RCM body to control a closing inductance value of the interconnection.

While various aspects and embodiments have been disclosed herein, other aspects and embodiments will be apparent to those skilled in the art. For example, the use of endothermic reactants/materials has been described herein with reference to 10 FIG. 9 as a constituent of stop layer 908 selected to inhibit energy and/or material flow between adjoining RCM segments A and B. However, it will understood that endothermic reactants/materials may be deployed for other purposes or in other arrangements of RCM materials in articles or article blanks (e.g., to control RCM reaction conditions and reaction propagation).

For example, endothermic reactants may be incorporated in a reactive multilayer structure along with exothermic materials (e.g., layer 106, FIG. 1). In general, an endothermic reaction that occurs thermodynamically with a negative change in Gibbs free energy (DG=DH–D (T S)) may either absorb or release energy according to the whether the change in enthalpy (DH) in the reaction is negative or positive. In the later type of reaction having a positive change in enthalpy (DH), the endothermic reaction may be accompanied by lowering of the temperature T to maintain a negative change in the Gibbs free energy. In accordance with the solutions described herein, the endothermic reactants incorporated in a reactive multilayer structure along with exothermic materials may be suitably selected to locally absorb or release energy, and/or regulate temperatures in the structure by either type of endothermic reaction.

An endothermic reactant may be a molecular species (e.g., calcium carbonate) that undergoes thermal dissociation. Alternatively or additionally, the endothermic reactants maybe two or more chemical species that can undergo an endothermic chemical reaction. The endothermic reactants may be inorganic and/or organic compounds (e.g., hydrated barium hydroxide, alumina trihydrate, ammonium chloride, nitrate or thiocynate, thionyl chloride ($SOCl_2$) and cobalt(II) sulfate heptahydrate, etc.). The endothermic reactants may have any suitable form. The endothermic reactants may, for example, be intermixed molecular compounds or combinations of discrete reactants in particle or layered forms.

Figure 16:
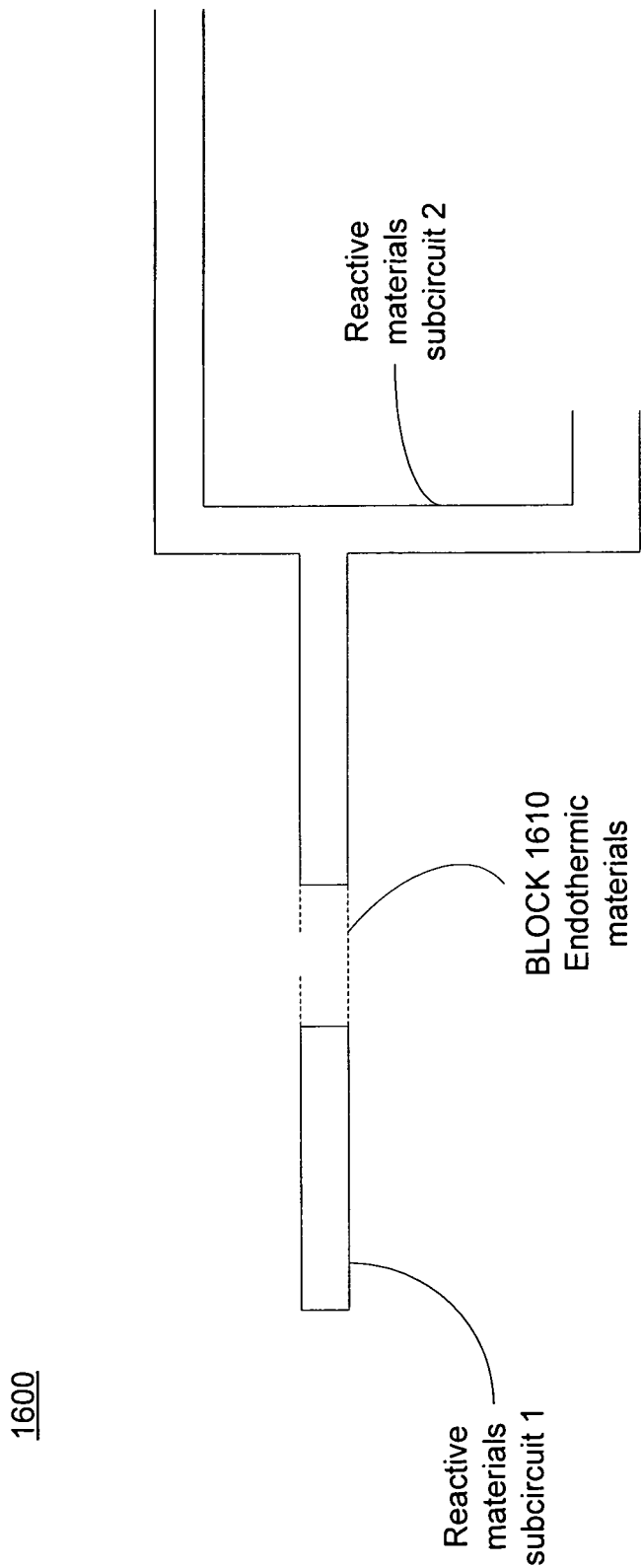
FIG. 16 is a schematic illustration of an exemplary article blank including a fire block made from endothermic materials, in accordance with the principles of the solutions described herein.

FIGS. 16, 17A and 17B show exemplary RCM structures 1600, 1700A and 1700B, respectively, that include endothermic materials that can chemically react to absorb heat and lower temperatures of the host material in which the structures are deployed (e.g., article blank 100).

FIG. 16 shows an exemplary RCM structure 1600 in which endothermic materials are deployed as a stop barrier or block 1610 to impede or prevent propagation of reactions between RCM subcircuits 1 and 2. The endothermic materials in block 1610 may be selected to act as a heat sink and absorb energy generated by exothermic reactions propagating on either sub circuit. Accordingly, block 1610 may act as a firebreak between the RCM subcircuits 1 and 2.

FIG. 17A shows an exemplary RCM structure 1700A in which exothermic reactive material layers 1720 are interleaved with endothermic reactive material layers 1730. Endothermic layers 1730 may be disposed in a suitable pattern designed to lower the temperatures of the adjoining endothermic reactive material layers 1730 and/or adjoining host material by absorbing a part of the heat generated by exothermic reactions in RCM structure 1700A. Thus, endothermic layers 1730 may provide control or limit propagation of temperature-dependent exothermic reactions in adjoining exothermic reactive material layers 1720.

It will be understood that the deployment of exothermic reactive material in layer shapes as shown in FIG. 17A is only exemplary. In practice, the exothermic reactive material may be deployed in any suitable shape or form. For example, FIG. 17B shows another exemplary RCM structure 1700B in which exothermic reactive material 1730 is disposed in a heat regulating pattern 1740 of discrete segments or islands proximate to a layered RCM structure 1750. Heat regulating pattern 1740 may be selected to limit or regulate a spatial temperature profile in the article or blank in which RCM structure 1700B is deployed.

It will be further understood that the deployment of endothermic reactive material in accordance with the solutions described herein is not limited to purposes of thermal management in article fabrication. The exothermic reactive materials may, for example, be deployed for in-situ synthesis of particular materials (i.e., the endothermic reaction products) in the articles Exothermic RCM materials may provide energy to drive spatially localized endothermic chemical reactions to place the particular materials at selected locations in an article blank (e.g., blank 100).

FIG. 18 shows an exemplary method 1800 for modulating or tempering an exothermic reaction and/or its effects in reactive composite materials. Method 1800 includes providing an article having an arrangement of reactive composite materials (RCM) having an exothermic reaction (18 10), and reacting endothermic reactants disposed proximate to the RCM to temper the exothermic reaction (1820). The endothermic reactants may be selected to undergo an endothermic chemical reaction having either a negative or positive enthalpy. The endothermic reaction in method 1800 may include absorbing heat generated by the exothermic reaction and/or limiting a temperature rise in the article. Further, method 1800 may include reacting endothermic reactants disposed between two RCM segments in the article to block an exothermic reaction in one RCM segment from propagating to the other RCM segment.

Figure 19:
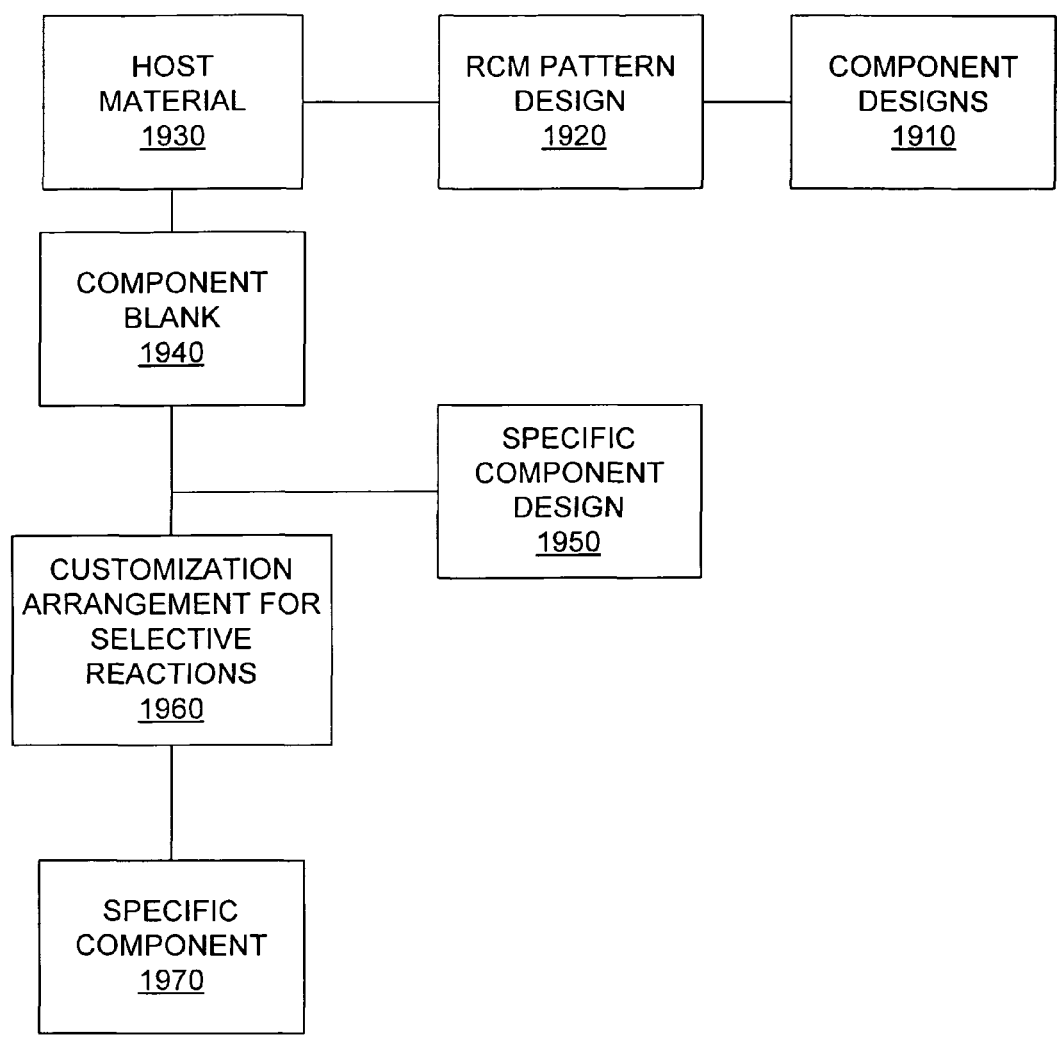
FIG. 19 is a block diagram illustrating an exemplary system for making RCM-based components, in accordance with the principles of the solutions described herein.

FIG. 19 shows a block diagram of a system 1900 for making a specific article or component 1970 based on RCM. System 1900 may include a set of one or more component designs 1910 including a specific design 1950 for specific article or component 1970. The set of component designs may correspond to one or more types of articles/components (e.g., passive devices, active devices, device terminals, posts or ports, resistors, capacitors, inductors, optical devices, electronic devices, microwave devices, rf devices, liquid crystal devices, mechanical devices and/or electromagnetic devices, metamaterial devices and/or any combination thereof) whose structures and characteristics may derive from RCM or their reactions. Further, the set of component designs may include designs corresponding to one or more variations or versions of each type of articles/components.

System 1900 further includes a component blank 1940 that can be customized to yield specific articles or components (e.g., specific article or component 1970) having a selected design 1950 from set 1910. Component blank 1940 may be prepared by disposing reactive materials and reaction control elements (e.g., endothermic materials, ignition circuits etc.) according to a RCM pattern design 1920 in or proximate to a suitable host material 1930.

RCM pattern design 1920 may a specific design corresponding to a specific component design. In particular, RCM pattern design 1920 may correspond to a design 1950 for specific article or component 1970. Alternatively, RCM pattern design 1920 may be a generic design corresponding to one or several component designs in set 1910 including the design for specific article or component 1970. RCM pattern design 1920 may include pre-reaction RCM elements or segments of any suitable type in any suitable geometry so that after reaction of selected portions of RCM pattern design 1920 in host material 1930, component blank 1940 corresponds to a selected one the several component designs in set 1920.

System 1900 further includes a customization arrangement 1960 for carrying out selected reactions in component blank 1940 according to a selected component design (e.g., specific design 1950) to produce specific article or component 1970. It will be understood that the fabrication of specific article or component 1970 from component blank 1940 may be complete as produced by customization arrangement 1960 or may require further processing steps (e.g., polishing, cleaning, trimming, soldering etc.) for completion. For example, fabrication of an optical component produced from component blank 1940 by customization arrangement 1960 may further involve cleaning, shaping, or polishing of surfaces for completion.

While various aspects and embodiments have been disclosed herein, other aspects and embodiments will be apparent to those skilled in the art. It will be understood that the various aspects and embodiments disclosed herein are for purposes of illustration and are not intended to be limiting, with the true scope and spirit being indicated by the following claims.

The invention claimed is:

1. A switch, comprising:
   a first and a second electrical conductors;
   a programmable reactive composite materials (RCM) body extending from the first to the second electrical conductor, the RCM body having a non-conducting state and a conducting state corresponding to a pre-reaction state and a post-reaction state, respectively; and
   a programming interface configured to programmably switch the RCM body from its non-conducting state to its conducting state.

2. The switch of claim 1, wherein the programmable RCM body is electrically programmable.

3. The switch of claim 1, wherein the programmable RCM body is optically programmable.

4. The switch of claim 1, wherein the programming interface comprises an ignition element configured to controllably initiate a reaction in the programmable RCM body.

5. The switch of claim 1, wherein a closing impedance value of the switch is responsive to a firing or reaction pattern in the programmable RCM body.

6. The switch of claim 1, wherein the programmable RCM body comprises reactive materials that have dielectric properties in the pre-reaction state and comprises one or more electrically conductive materials in the post-reaction state.

7. The switch of claim 1, wherein the programmable RCM body comprises at least one of Ba, carbon and its compounds, Ca, Ce, Cr, Co, Fe, Hf, Mg, Mn, Mo, Nb, Ni, Si, Ta, Ti, Th, V, W, and Zr. Mo, Cu, Ti, Zr, Hf, V, Nb, Ta, Ni, Pd, Rh, Ni, Zr, B, C, Si, Al, Fe2O3, CuzO, MoO3, FeCo, FeCoOx a carbide, a nitride, monel, an alloy, a metallic glass, or a metal ceramic.

8. The switch of claim 1, wherein the programmable RCM body comprises reactive multilayered materials.

9. The switch of claim 1, wherein the programmable RCM body comprises reactive multilayered material nanofoils.

10. The switch of claim 1, wherein the programmable RCM body comprises reactive multilayered materials placed in a via in an insulating layer.

11. The switch of claim 1, wherein the programmable RCM body comprises a laterally patterned RCM segment.

12. The switch of claim 1, wherein the first electrical conductor comprises a capacitor plate and the second electrical conductor comprises a grounding conductor, and wherein the programmable RCM body is configured to discharge the capacitor plate in the RCM body's reacted state.

13. The switch of claim 1, wherein the first and second electrical conductors comprises two oppositely charging plates of a capacitor, and wherein the programmable RCM body is configured to short the capacitor in the programmable RCM body's reacted state.

14. The switch of claim 1 disposed in an integrated circuit.

15. A method for interconnecting two electrical conductors, the method comprising:
   providing a programmable reactive composite materials (RCM) body extending between the two electrical conductors, the programmable RCM body having a non-conducting state and a conducting state corresponding to a pre-reaction state and a post-reaction state, respectively, of the reactive composite materials therein; and
   providing a programming interface configured to programmably switch the RCM body from its non-conducting state to its conducting state.

16. The method of claim 15, wherein the programmable RCM body is electrically programmable.

17. The method of claim 15, wherein the programmable RCM body is optically programmable.

18. The method of claim 15, further comprising, providing an ignition element configured to controllably initiate a reaction in the programmable RCM body.

19. The method of claim 15, wherein a closing impedance value of the switch is responsive to a firing or reaction pattern in the programmable RCM body.

20. The method of claim 15, wherein the programmable RCM body comprises reactive materials that have dielectric properties in the pre-reaction state and comprises one or more electrically conductive materials in the post-reaction state.

21. The method of claim 15, wherein the programmable RCM body comprises wherein the programmable RCM body comprises at least one of Ba, carbon and its compounds, Ca, Ce, Cr, Co, Fe, Hf, Mg, Mn, Mo, Nb, Ni, Si, Ta, Ti, Th, V, W, and Zr. Mo, Cu, Ti, Zr, Hf, V, Nb, Ta, Ni, Pd, Rh, Ni, Zr, B, C, Si, Al, Fe2O3, CuzO, MoO3, FeCo, FeCoOx a carbide, a nitride, monel, an alloy, a metallic glass, or a metal ceramic.

22. The method of claim 15, wherein the programmable RCM body comprises reactive multilayered materials.

23. The method of claim 15, wherein the programmable RCM body comprises reactive multilayered material nanofoils.

24. The method of claim 15, wherein the programmable RCM body comprises reactive multilayered materials placed in a via in an insulating layer.

25. The method of claim 15, wherein the programmable RCM body comprises a laterally patterned RCM segment.

26. The method of claim 15, wherein one of the two electrical conductors comprises a capacitor plate and the second of the two electrical conductors comprises a grounding conductor, and wherein the programmable RCM body is configured to discharge the capacitor plate in the programmable RCM body's reacted state.

27. The method of claim 15, wherein the two electrical conductors comprise two oppositely charging plates of a capacitor, and wherein the programmable RCM body is configured to short the capacitor in the programmable RCM body's reacted state.

28. The method of claim 15, wherein the two electrical conductors are disposed in an integrated circuit.

29. A method for interconnecting two electrical conductors, the method comprising:
  initiating a reaction in a reactive composite materials (RCM) body extending between the two electrical conductors, the RCM body having a non-conducting state and a conducting state corresponding to a pre-reaction state and a post-reaction state, respectively, of the reactive composite materials therein.

30. The method of claim 29, wherein initiating a reaction in the RCM body comprises electrically initiating the reaction.

31. The method of claim 29, wherein initiating a reaction in the RCM body comprises optically initiating the reaction.

32. The method of claim 29, wherein initiating a reaction in the RCM body comprises thermally initiating the reaction in the RCM body.

33. The method of claim 29, wherein initiating a reaction in the RCM body comprises initiating the reaction in a pattern to control a closing impedance value between the two electrical conductors.

34. The method of claim 29, wherein the two electrical conductors are two oppositely charging plates of a capacitor, and wherein initiating a reaction in the RCM body comprises shorting the capacitor.

35. The method of claim 29, wherein one of the two electrical conductors is a capacitor plate and the second of the two electrical conductors is a grounding conductor, and wherein initiating a reaction in the RCM body comprises discharging the capacitor plate.

* * * * *